United States Patent
Hioki et al.

[11] Patent Number: 5,266,398
[45] Date of Patent: Nov. 30, 1993

[54] AMORPHOUS THIN FILM AS SOLID LUBRICANT ON A SUBSTRATE AND METHOD FOR PRODUCTION THEREOF

[75] Inventors: Tatsumi Hioki; Kazuyuki Oguri, both of Aichi, Japan

[73] Assignee: Kabushiki Kaisha Toyota Chuo Kenkyusho, Aichi, Japan

[21] Appl. No.: 945,885

[22] Filed: Sep. 17, 1992

[30] Foreign Application Priority Data

Sep. 20, 1991 [JP] Japan .................. 3-270380

[51] Int. Cl.⁵ ................................ B32B 9/00
[52] U.S. Cl. ......................... 428/336; 427/249; 427/255.3; 427/294; 427/527; 427/535; 427/543; 427/563; 427/568; 427/577; 427/578; 427/588; 427/591; 428/688; 428/702

[58] Field of Search ........... 427/294, 255.3, 249, 427/527, 535, 591, 540, , 568, 577, 563, 578, 543, 588; 428/702, 688, 336

Primary Examiner—Bernard Pianalto
Attorney, Agent, or Firm—Oblon, Spivak, McClelland, Maier & Neustadt

[57] ABSTRACT

An amorphous thin film as a solid lubricant having a low coefficient of friction. It is composed of silicon (Si), oxygen (O), carbon (C), and hydrogen (H), and has a composition defined by the formula: $Si_x (O_m, C_n, H_{l-m-n})_{1-x}$ where, $x=0.03-0.02$, $m=0.05-0.5$, $=0.1-0.9$, and $0.6 \leq m+n \leq 0.95$. This thin film exhibits extremely low friction stably from the beginning of sliding. It has superior wear resistance owing to its high hardness.

6 Claims, 4 Drawing Sheets

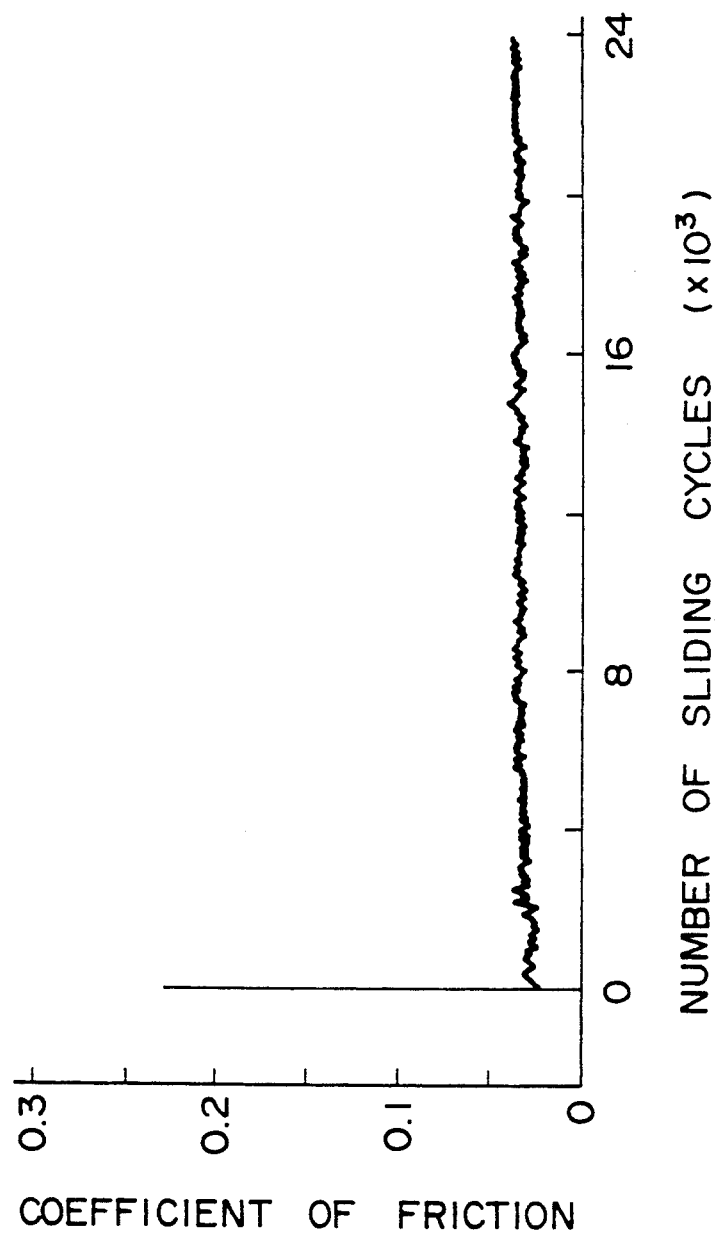

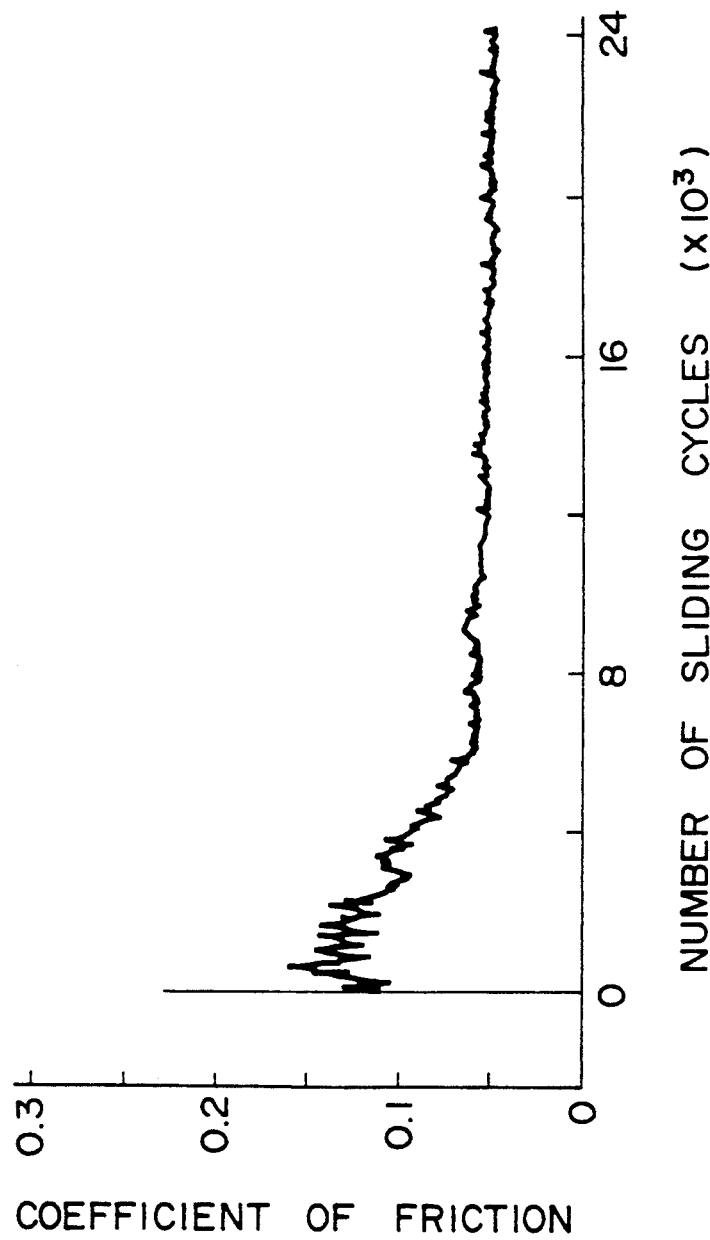

AMORPHOUS THIN FILM AS SOLID LUBRICANT ON A SUBSTRATE AND METHOD FOR PRODUCTION THEREOF

BACKGROUND OF THE INVENTION

Field of the Invention

The present invention relates to an amorphous thin film as a solid lubricant and also to a process for producing the same. More particularly, the present invention relates to an amorphous thin film which exhibits a lower coefficient of friction than that of $SiO_2$ thin film (known as a low-friction material) and retains its low coefficient of friction stably in the atmosphere, and also relates to a process for producing the same.

Description of the Related Art

It has been reported that $SiO_2$ thin film decreases in friction coefficient upon adsorption of a gas from the atmosphere due to so-called contamination lubrication. (See I.E.E.E. Trans. MAG-18 (1982) 1215.)

It has also been reported that Si-based ceramics exhibits low friction in water. (See "Junkatsu" (Lubrication), 33 (1988) 620.) It is considered that this phenomenon is associated with $SiO_2$ which is formed by sliding.

In the former case, the coefficient of friction is about 0.2, which is not so low. In the latter case, the coefficient of friction is as low as 0.01, but this is available only under a special condition of water lubrication.

The mechanism of low friction is not yet fully elucidated. A conceivable reason is that a thin water film forms on the surface of silicon oxide upon adsorption of water by SiOH (silanol) groups.

SUMMARY OF THE INVENTION

In order to solve the above-mentioned problems involved in the prior art technology, the present inventors carried out a series of researches which led to the present invention.

It is an object of the present invention to provide an amorphous thin film as a solid lubricant having a low friction coefficient.

It is another object of the present invention to provide a process for producing the amorphous thin film.

It is a further object of the present invention to provide an $SiO_2$-based thin film which, in the absence of lubricant, exhibits a friction coefficient of the order of 0.01 as Si-based ceramics does in water due to $SiO_2$.

The present inventors have conceived an idea that an $SiO_2$-based thin film (i.e. a thin film containing $SiO_2$ from the first) will exhibit a low friction coefficient which remains stable from the beginning of sliding, and an idea that the composition including carbon and hydrogen will stabilize and lower the friction coefficient of such film based on only $SiO_2$ (whose friction coefficient is approximately 0.2). Carbon has been selected because it exhibits a low friction as diamond and graphite. Hydrogen has been selected because, if it is included from the first, it easily forms silanol groups on the surface for stable water adsorption. The present invention is based on these ideas.

The present invention is embodied in an amorphous thin film as a solid lubricant which comprises of silicon (Si), oxygen (O), carbon (C), and hydrogen (H), and has a composition defined by the following formula:

$$Si_x(O_m, C_n, H_{1-m-n})_{1-x}$$

where, $x=0.03-0.20$, $m=0.05-0.5$, $n=0.1-0.9$, and $0.6 \leq m+n \leq 0.95$.

It is not yet clear why the amorphous thin film as a solid lubricant of the present invention exerts such favorable effects, but the mechanism may be explained as follows. The amorphous thin film exhibited a friction coefficient as low as approximately 0.05 even in the beginning of sliding when it slided on steel. The analysis of debris on the steel after sliding revealed that it was composed of silicon oxide, water, and graphite-like carbon. It is considered that the low friction coefficient is attributable to the water (and graphite-like carbon), and that the low friction is maintained during sliding owing to a thin film of water adsorbed on the surface of $SiO_2$ and also owing to the graphite-like carbon which is inherently water-repellent and has low friction.

According to the present invention, the amorphous thin film should contain silicon ($Si_x$) as the major constituent in a specific amount such that $x=0.03-0.20$. The lower limit is based on an assumption that the silicon, even in the minimum amount, will form during sliding a certain amount of $SiO_2$ which adsorbs enough water to produce low friction. The upper limit is established so that the silicon is incorporated with carbon and hydrogen to produce a stable low friction coefficient of about 0.05, even though x would take a maximum value of ⅓ if the thin film is made entirely of $SiO_2$.

The amount of oxygen ($O_m$) in the thin film should be such that $m=0.05-0.5$. The function of oxygen is to facilitate the formation of $SiO_2$ in the thin film, thereby providing stable low friction even in the beginning of sliding. Oxygen in an amount less than the lower limit does not fully produce its effect. Oxygen in an amount in excess of the upper limit limits the amount of carbon and hydrogen that should be added to produce the desired effect.

The amount of carbon ($C_n$) in the thin film should be such that $n=0.1-0.9$. Carbon, which inherently has a low friction coefficient, produces a synergistic effect with $SiO_2$ to lower the friction coefficient of the thin film. In addition, carbon has water repellency which contributes to the low friction mechanism by $SiO_2$ and water. With an amount less than the lower limit, the carbon does not produce the desired synergistic effect. With an amount more than the upper limit, the carbon limits the amount of oxygen and hydrogen that should be added to produce the desired effect.

The amount of hydrogen ($H_{1-m-n}$) in the thin film should be such that $0.05 \leq 1-m-n \leq 0.4$ or $0.6 \leq m+n \leq 0.95$. The function of hydrogen in the thin film is to facilitate the formation of SiOH (silanol) groups on the surface of $SiO_2$. Silanol groups adsorb water in a stable manner to contribute to the low friction coefficient which is stable even in the beginning of sliding. With an amount less than the lower limit, the hydrogen does not produce the desired effect. With an amount in excess of the upper limit, the hydrogen prevents the formation of compact thin film.

The carbon and hydrogen incorporated into the thin film permit the thin film to exhibit a friction coefficient of the order of 0.05 in the atmosphere without lubricant which is attained only in water if the thin film is composed of $SiO_2$ alone.

The amorphous thin film of the present invention is superior in wear resistance owing to its extremely low friction coefficient and high hardness. Moreover, it exhibits stable friction properties even in the beginning of sliding.

BRIEF DESCRIPTION OF THE DRAWINGS

FIG. 3 is a graph showing the relation between the coefficient of friction and the frequency of sliding which indicates the performance of the sample in Example 2.

FIG. 4 is a graph showing the relation between the coefficient of friction and the frequency of sliding which indicates the performance of the comparative sample in Example 2.

DETAILED DESCRIPTION OF THE INVENTION

According to the present invention, the amorphous thin film should preferably have a thickness in the range of 0.1-10 μm. With a thickness smaller than 0.1 μm, the thin film does not fully exhibit its performance. With a thickness greater than 10 μm, the thin film is liable to peeling. The thin film may contain argon, nitrogen, chlorine, etc. in small amounts not harmful to the effect of the present invention. The thin film is flat enough to faithfully reproduce the surface roughness of the article to be treated.

The amorphous thin film of the present invention exhibits a friction coefficient lower than 0.05. Therefore, it can be advantageously applied to a sliding material which cannot be lubricated.

According to the present invention, the amorphous thin film as a solid lubricant is produced by: disposing an article to be treated in a vacuum container; heating and depositing an organic substance on the article in a vacuum atmosphere, the organic substance comprising Si, O, C, and H such that the resulting deposited film has a composition defined by the formula:

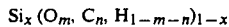

where, x=0.02-0.15, m=0.05-0.3, n=0.1-0.6, and 0.6≦m+n≦0.65, thereby forming the deposited film on the article; and simultaneously irradiating on the article ions of a gaseous element having energy of 2 keV or more at a dose of 1×10$^{15}$ions/cm$^2$ or more.

According to the process of the present invention, an organic substance comprising Si, O, C, and H is heated in a vacuum container for deposition on an article to be treated. The deposited film has a composition defined by the formula:

$Si_x (O_m, C_n, H_{1-m-n})_{1-x}$ where, x=0.02-0.15, m=0.05-0.3, n=0.1-0.6, and 0.4≦m+n≦0.65.

While the vacuum deposition is proceeding, the article to be treated is irradiated with ions of a gaseous element having energy of 2 keV or more at a dose of 1×10$^{15}$ ions /cm$^2$ or more. This irradiation reduces a certain amount of hydrogen, thereby forming a solid amorphous thin film. Since the reduction of hydrogen somewhat changes the starting composition, the amorphous thin film has a composition defined by the formula:

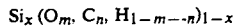

where, x=0.03-0.20, m=0.05-0.5, n=0.1-0.9, and 0.6≦m+n≦0.95.

The thus obtained amorphous thin film exhibits an extremely low coefficient of friction. It also exhibits outstanding wear resistance owing to high hardness.

The combination of vacuum deposition and ion irradiation permits the article to be treated at room temperature or below. Therefore, the process of the present invention can be applied to a variety of articles to be treated and also to those which need high dimensional accuracy.

The process of the present invention will be described in more detail with reference to FIG. 1.

Figure 1:
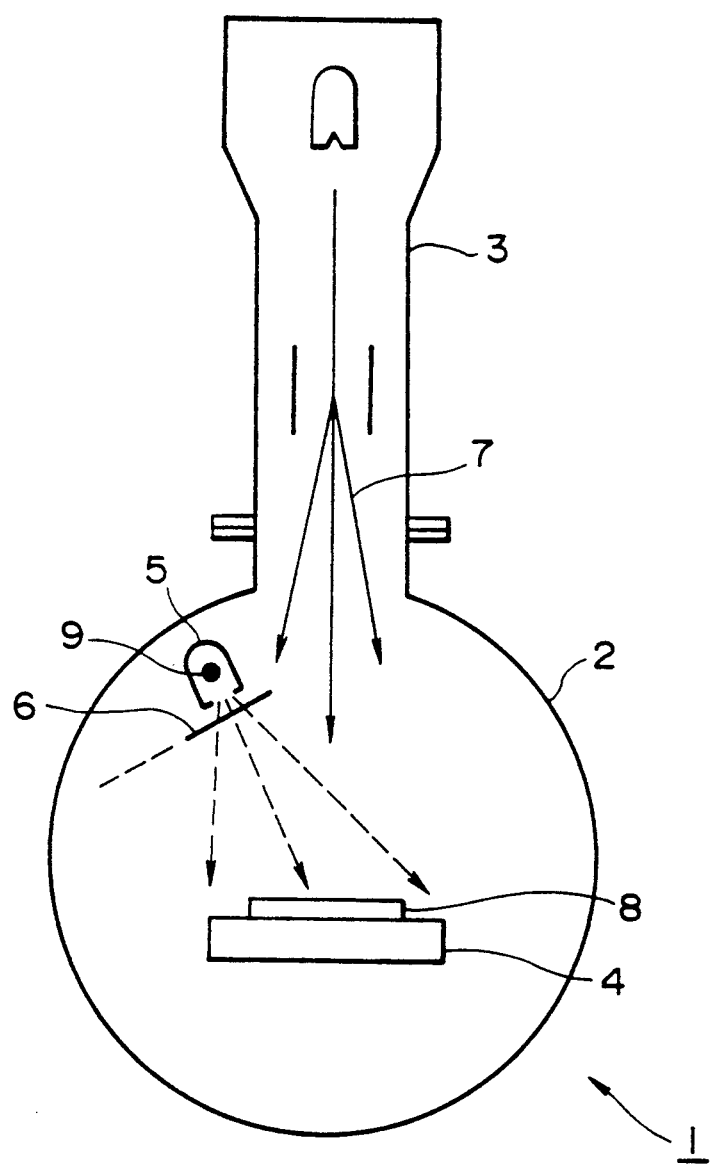
FIG. 1 is a schematic diagram showing an apparatus used for producing the amorphous thin film according to the present invention.

FIG. 1 shows an apparatus 1 for coating an article to be treated with a thin film. This apparatus 1 is made up of a vacuum container 2, an ion beam generator 3, a substrate holder 4, a furnace 5, and a shutter 6. The vacuum container 2 is connected to the high-energy ion beam generator 3 in such a way that an ion beam 7 generated by the ion beam generator 3 is introduced into the vacuum container 2. The substrate holder 4 holds an article to be treated 8 at a desired position. The furnace 5 heats and deposits an organic substance 9 as the source of deposition. It is fixed above the article to be treated 8 in the vacuum container 2. The shutter 6 prevents the organic substance heated in the furnace 5 from diffusing into the vacuum container unnecessarily. It opens when the furnace 5 is heated to a predetermined temperature. Its opening triggers irradiation with the ion beam 7. The period in which the shutter 6 remains open determines the thickness of the amorphous thin film deposited on the article to be treated 8. The dose of irradiation in a certain period of time depends on the current density of the ion beam 7.

The organic substance as the vapor source is placed in the vacuum container so that the vapor deposition is carried out simultaneously with the ion irradiation. The ion irradiation needs a high degree of vacuum of 10$^{-4}$ Torr or less. The organic substance as the vapor source containing Si and O should be one which has a vapor pressure of 10$^{-4}$ Torr or more at room temperature. It may be a liquid or solid at room temperature. Typical examples include silicone oils such as methylphenylsiloxane, polydimethylsiloxane, and pentaphenyltrimethyltrisiloxane. They may be used alone or in combination. An adequate one should be selected so that the deposited film has a composition defined by the formula:

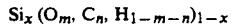

where, x=0.02-0.15, m=0.05-0.3, n=0.1-0.6, and 0.4≦m+n≦0.65.

There are no restrictions on the ion beam for irradiation so long as it can decompose and carbonize the organic substance. Any ion species can be used. Preferred ones are He, N, Ne, Ar, Kr, and Xe, which readily form an ion beam.

The ion beam should have a certain amount of energy, which is usually more than 1 keV, so that it can decompose and carbonize the organic substance.

The dose of ion irradiation required varies depending on the ion species used. It is 1×10$^{16}$ions/cm$^2$ or more in the case of helium ion beam, and it is $1\times 10^{15}$ ions/cm$^2$ or more in other cases. Insufficient doses give rise to an amorphous thin film poor in adhesion.

According to another aspect of the present invention, the amorphous thin film as a solid lubricant is produced by: disposing an article to be treated in a vacuum container; evacuating a remaining gas from the vacuum container; introducing a heating gas into the vacuum container and heating the surface of the article to a predetermined temperature; and introducing into the vacuum container a film forming gas comprising a silicon compound gas, an oxygen compound gas, a carbon compound gas, and a hydrogen compound gas, and causing discharge, thereby forming the amorphous thin film on the article to be treated. In this process, discharge is caused to genarate a plasma in an atmosphere composed mainly of a silicon compound gas, an oxygen compound, a carbon compound gas, and a hydrogen compound gas.

This process offers an advantage that the composition of a thin film can be controlled as desired by selecting the composition of the atmosphere and the film-forming temperature. The resulting amorphous thin film has a uniform thickness of several microns, and hence it can be formed on any object of complex shape. It exhibits an extremely low friction coefficient and also has superior wear resistance owing to high hardness.

The process just mentioned above is explained with reference to FIG. 2. First, an article to be treated is disposed on a holder in a vacuum container for plasma CVD. The vacuum container is evacuated to a vacuum of less than $10^{-4}$ Torr. With evacuation continued, hydrogen (as a heating gas) is introduced into the vacuum container. DC discharges or high-frequency discharges are induced to produce a plasma which heats the article to be treated to a predetermined temperature (approximately 500° C.). This preliminary heating prevents the surface layer from being contaminated with chlorine, etc. which are detrimental to the thin film. Then, the discharge is caused in the atmosphere of a film forming gas composed of an atmosphere gas and a reactive gas. The atmosphere gas is hydrogen, argon or the like. The reactive gas is composed of a silicon compound gas, an oxygen compound gas, a carbon compound gas, and a hydrogen compound gas. (The last one is not necessary in the case where sufficient hydrogen is supplied as the atmosphere gas.) Examples of the silicon compound gas include silicon tetrachloride (SiCl$_4$), silicon tetrafluoride (SiF$_4$), trichlorosilane (SiHCl$_3$), and tetramethylsilicon (Si(CH$_3$)$_4$) Examples of the oxygen compound gas include O$_2$, CO, CO$_2$, and H$_2$O. Examples of the carbon compound gas include methane (CH$_4$) and other hydrocarbon gases (C$_m$H$_n$). Examples of the hydrogen compound gas include H$_2$ and H$_2$O. Many of these gases supply two or more elements such as CO and H$_2$O.

The composition of the film forming gas should be properly established according to the kind of gas and the temperature of reaction. The flow rate of the film forming gas depends on the volume of the vacuum container and the amount of gas being discharged. A film forming gas composed of SiCl$_4$ (as the silicon compound gas), H$_2$O (as the oxygen compound gas), CH$_4$ (as the carbon compound gas), and at least one of H$_2$, H$_2$O, and CH$_4$ (as the hydrogen compound gas) may have a typical composition given below which is expressed in terms of the relative flow ratio of the individual components.

| | |
|---|---|
| SiCl$_4$ | 1 |
| H$_2$O | 5–50 |
| CH$_4$ | 5–50 |
| H$_2$ | 50–500 |
| Ar | 30–300 |

The film forming gas may be introduced in any form into the vacuum container so long as it contains the above-mentioned substances necessary to form the thin film.

The pressure in the vacuum container should preferably be in the range of from $10^{-2}$ to 10 Torr. More specifically, the desirable pressure for DC discharges is $10^{-1}$ to 10 Torr, and the desirable pressure for high-frequency discharges is $10^{-2}$ to 10 Torr. Discharges will be unstable under pressures outside the specified range.

Thus, the amorphous thin film having an extremely low friction coefficient can be easily produced according to the process of the present invention. Now, the invention will be described in more detail with reference to the following examples.

EXAMPLE 1

This example demonstrates the formation of an amorphous thin film on an article to be treated of high speed steel by ion irradiation and organic vapor deposition using an apparatus as shown in FIG. 1. The resulting product is designated as Sample No 1.

The article to be treated is a disc (3 mm thick and 30 mm in diameter) of high-speed steel (JIS SKH51, quenched and tempered), having a surface roughness of 0.1 μm or below. The article to be treated underwent vapor deposition with pentaphenyltrimethyltrisiloxane at 70° C. Simultaneously, the article to be treated underwent Ar$^+$ion irradiation with the energy of 100 keV. The dose of ion irradiation was $1\times 10^{16}$ ions/cm$^2$.

The thus obtained amorphous thin film was found to have a thickness of $0.12\pm 0.02$ μm measured by the backscattering method and a surface roughness meter. It was also found to have a composition of Si$_{0.07}$(O$_{0.05}$C$_{0.34}$H$_{0.11}$)$_{-0.93}$ determined by the backscattering method using H$^+$ ions.

The coated disk was tested for friction-wear characteristic using a ball-on-disc friction tester. The test method consists of pressing a steel ball (5 mm in diameter, conforming to JIS SUJ2, quenched and tempered) under a load of 0.2 kg against the disk rotating at 80 rpm, without lubricant at room temperature in the air. The results are shown in Table 1.

TABLE 1

| Sample No. | Friction coefficient |
|---|---|
| 1 | 0.02 |
| C1 | 0.20 |
| C2 | 0.15 |

For comparison, Sample No. C1 was prepared by coating the disc with a 0.15 μm thick carbon film formed from molten graphite by electron beam vapor deposition. Sample No. C2 was also prepared by subjecting Sample No. C1 to Ar$^+$ ion irradiation with the energy of 100 keV and at a dose of $1\times 10^{16}$ ions/cm$^2$. The results of their evaluation are shown in Table 1.

It is clear from Table 1 that Sample No. 1 has a friction coefficient as low as 0.02, whereas Samples Nos. C1 and C2, which are coated with a carbon thin film free of silicon and oxygen, have a friction coefficient which is one order of magnitude higher.

EXAMPLE 2

Figure 2:
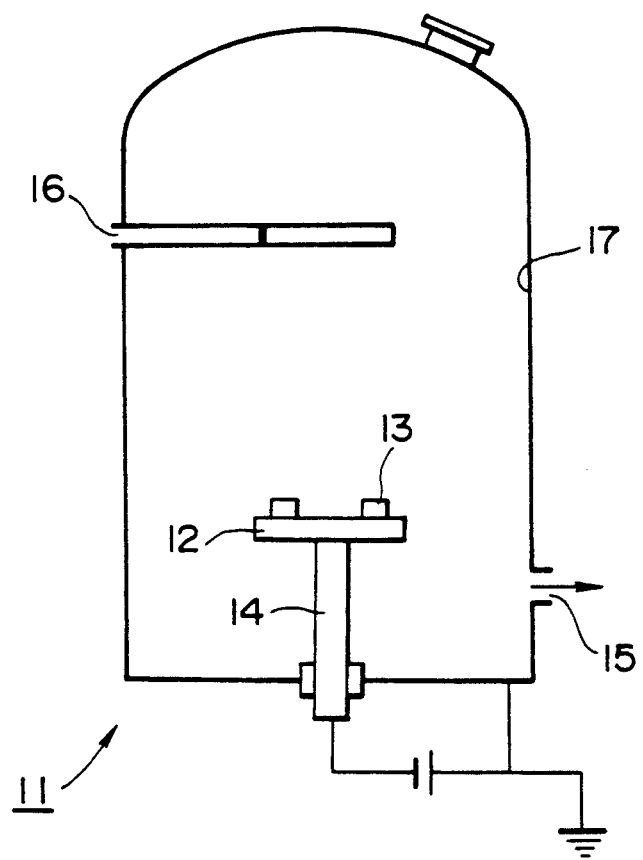
FIG. 2 is a schematic diagram showing an apparatus for plasma chemical vapor deposition which is used for producing the amorphous thin film according to the present invention.

This example demonstrates the formation of an amorphous thin film of carbon-hydrogen-oxygen-silicon on an article to be treated of high-speed steel by plasma chemical vapor deposition using an apparatus as shown in FIG. 2. The resulting product is designated as Sample No. 2.

The article to be treated 13 is a cylindrical piece (20 mm in diameter and 10 mm thick) of high-speed steel (JIS SKH51). Five substrates were arranged on the holder 12 at equal intervals, 60 mm away from the center. The holder 12 is at the center of the plasma reaction chamber 11 made of stainless steel. The pedestal 14 of the holder 12 has a pipe (not shown) therein to supply cooling water.

To start plasma chemical vapor deposition, the plasma reaction chamber 11 was evacuated to $10^{-4}$ Torr by means of a rotary pump and diffusion pump (both not shown) connected to a gas outlet 15. Incidentally, the plasma reaction chamber 1 has a gas inlet 16 which is connected to several gas cylinders (not shown) through control valves.

Hydrogen (as a heating gas) was introduced into the evacuated reaction chamber 11. At the same time, evacuation was continued so that the pressure of the reaction chamber 11 remained at 1 Torr. Then, discharge was induced by application of DC current (of some hundreds of volts) across the wall of the reaction chamber 11 (which servers as an anode 17) and the holder 12 (which serves as a cathode). Discharge was continued until ion bombardment heated the surface of the article to be treated to 550° C. The DC circuit is so controlled as to keep constant the temperature of the article to be treated according to outputs from a two-color pyrometer (not shown) which measures the temperature of the article to be treated.

To carry out chemical vapor deposition, silicon tetrachloride (gas), water vapor, methane, hydrogen, and argon were introduced into the reaction chamber at a flow rate of 3, 30, 50, 1000, and 700 cc/min, respectively, so that they formed an atmosphere having a total pressure of 4 Torr. With the article to be treated kept at 550° C., DC discharge was continued for 1 hour to effect chemical vapor deposition.

After the completion of chemical vapor deposition, the coated article to treated was cooled under reduced pressure and removed from the reaction chamber 11. It was found that the article to be treated was coated with a 2 μm thick black film.

The black film was examined by X-ray diffractometry. No diffraction was noticed except the one due to the substrate. This suggests that the black film is amorphous. The black film was also examined for composition by electron probe microanalysis and elastic scattering. It was found to have a composition defined by $Si_{0.15}(O_{0.3}, C_{0.4}, H_{0.3})_{0.85}$, with a trace amount of chlorine. The coated specimen was tested for friction and wear properties in the same manner as in Example 1. The results are shown in Table 2. The relation between the coefficient of friction and the number of sliding cycles is shown in FIG. 3.

TABLE 2

| Sample No. | Coefficient of friction |
|---|---|
| 2 | 0.03 |
| C3 | 0.2–0.5* |

*varied with exposure time in the atmosphere.

For comparison, the same procedure as mentioned above was repeated to prepare Sample No. C3 except that methane was not used. It was found that the article to be treated was coated with a 2 μm thick translucent film which assumes an interference color. The thin film was found to be amorphous and have a composition defined by $Si_{0.25}(O_{0.47}, H_{0.53})_{0.75}$. The thin film was tested for friction-wear characteristic in the same manner as mentioned above. The results are shown in Table 2.

For another comparison, the same procedure as in Example 2 was repeated to give Sample No. C4 except that the reactive gas was replaced by the one which is composed of silicon tetrachloride, methane, hydrogen, and argon. It was found that the article to be treated was coated with a black thin film. This black thin film was found to be amorphous by X-ray diffractometry as in the case mentioned above. Examination by electron probe microanalysis and elastic scattering indicated that the black thin film has a composition defined by $Si_{0.10}(O_{0.6}, H_{0.4})_{0.90}$. The sample was tested for friction and wear characteristic in the same manner as in Example 1. The relation between the coefficient of friction and the number of sliding cycles is shown in FIG. 4.

It is clear from Table 2 that Sample No. 2 has a friction coefficient as low as 0.03, whereas Sample No. C3 has a friction coefficient which broadly varies, with the lowest value being as high as 0.2. It is also clear that the amorphous thin film obtained in this example exhibits a very low friction coefficient (0.03) even in the beginning of sliding and maintains this low friction coefficient stably afterwards regardless of the load and speed.

It is noted from FIG. 4 that Sample No. C4 (for comparison) exhibits high friction coefficients (0.1–0.15) at the beginning of sliding. Presumably, this is because the thin film contains no oxygen and it takes a long time for silicon in the thin film to combine with oxygen in the atmosphere to form an oxide which contributes to low friction.

What is claimed is:

1. An amorphous thin film as a solid lubricant coated upon a base which comprises silicon (Si), oxygen (O), carbon (C), and hydrogen (H), said thin film having a composition defined by the formula:

where, $x=0.03-0.20$, $m=0.05-0.5$, $n=0.1-0.9$, and $0.6 \leq m+n \leq 0.95$.

2. An amorphous thin film according to claim 1, wherein said thin film has a thickness of 0.5–10 μm.

3. A process for producing an amorphous thin film as a solid lubricant, which comprises
disposing an article to be treated in a vacuum container,
heating and depositing an organic substance on said article in a vacuum atmosphere, of $1 \times 10^{-4}$ Torr or less said organic substance comprising Si, O, C, and H such that the resulting deposited film has a composition defined by the formula:

where, $x=0.02$–$0.15$, $m=0.05$–$0.3$, $n=0.1$–$0.6$, and $0.4 \leq m+n \leq 0.65$, thereby forming the deposited film on said article, and simultaneously irradiating on said article ions of a gaseous element having energy of 2 keV or more at a dose of $1 \times 10^{15}$ ions/cm² or more in a vacuum atmosphere of $1 \times 10^{-4}$ Torr or less.

4. A process according to claim 3, wherein $He^+$ ions are used for ion irradiation at a dose of $1 \times 10^{16}$ ions/cm² or more.

5. A process for producing an amorphous thin film as a solid lubricant, which comprises:

disposing an article to be treated in a vacuum container, evacuating any remaining gas from said vacuum container, introducing a heating gas into said vacuum container, and heating the surface of said article to a predetermined temperature, and introducing into said vacuum container a film forming gas comprising a silicon compound gas, an oxygen compound gas, a carbon compound gas, and a hydrogen compound gas, and causing discharge, thereby forming an amorphous thin film on said article, and said amorphous thin film has a composition defined by the following formula:

$$Si_x(O_m,C_n,H_{1-m-n})_{1-x}$$

wherein, $x=0.03$–$0.20$, $m=0.05$–$0.5$, $n=0.1$–$0.9$, and $0.6 \leq m+n \leq 0.95$.

6. A process according to claim 5, wherein said film forming gas comprises $SiCl_4H_2O$, $CH_4$, $H_2$, and $Ar$ in relative amounts of 1, 5-50, 5-50, 50-500, and 30-300, respectively, in terms of flow rates thereof.

* * * * *